(12) United States Patent
Kuga

(10) Patent No.: US 10,571,488 B2
(45) Date of Patent: Feb. 25, 2020

(54) PROBE FOR A CONTACT INSPECTION DEVICE

(71) Applicant: Kabushiki Kaisha Nihon Micronics, Musashino-shi (JP)

(72) Inventor: Tomoaki Kuga, Musashino (JP)

(73) Assignee: Kabushiki Kaisha Nihon Micronics, Musashino-shi (JP)

(*) Notice: Subject to any disclaimer, the term of this patent is extended or adjusted under 35 U.S.C. 154(b) by 169 days.

(21) Appl. No.: 15/717,254

(22) Filed: Sep. 27, 2017

(65) Prior Publication Data

US 2018/0088150 A1    Mar. 29, 2018

(30) Foreign Application Priority Data

Sep. 28, 2016 (JP) .................. 2016-189817

(51) Int. Cl.
G01R 1/067      (2006.01)
G01R 31/20      (2006.01)
G01R 1/073      (2006.01)

(52) U.S. Cl.
CPC ...... G01R 1/07371 (2013.01); G01R 1/06711 (2013.01); G01R 1/06716 (2013.01); G01R 1/07314 (2013.01); G01R 1/07357 (2013.01)

(58) Field of Classification Search
CPC ............ G01R 1/06711; G01R 1/06716; G01R 1/07357; G01R 1/07314; G01R 1/07371; G01R 31/26; H01R 13/24; H01R 13/03; H01R 13/2435; H01R 13/76; H01R 12/57; H01R 12/88
See application file for complete search history.

(56) References Cited

U.S. PATENT DOCUMENTS 5,532,613 A * 7/1996 Nagasawa .......... G01R 1/06711
                                                        137/312
6,300,783 B1 * 10/2001 Okubo ............... G01R 1/07357
                                                        324/755.06

FOREIGN PATENT DOCUMENTS

JP          4965341 B      7/2012

OTHER PUBLICATIONS

JP 2008-298555 Translation.*

* cited by examiner

*Primary Examiner* — Minh N Tang
(74) *Attorney, Agent, or Firm* — Leason Ellis LLP

(57) ABSTRACT

A probe includes: a probe base body having a first end as a portion that contacts a test object in an inspection and a second end that contacts a contact point member; a covering member that covers the probe base body between the first end and the second end; and an enlarged diameter portion 6 provided at an exposed portion on the second end side of the probe base body. The probe is attached in a bent-deformed state by pressing a terminal portion on the first end side of the covering member against a base portion of the contact inspection device. The second end of the probe base body is pressed against a contact point of the contact point member by opposing force due to the pressing.

18 Claims, 6 Drawing Sheets

PROBE FOR A CONTACT INSPECTION DEVICE

This application claims the benefit of Japanese Patent Application No. 2016-189817 filed on Sep. 28, 2016, which is incorporated herein by reference in its entirety.

FIELD OF THE INVENTION

The present invention relates to a probe that is attached to a contact inspection device used for inspection of, for example a circuit board and used by being pressed against a test object, a probe card that includes the probe, and a contact inspection device that includes the probe card.

BACKGROUND OF THE INVENTION

Japanese Patent No. 4965341 is an example of the related art document of such a probe. FIG. 7 in this document illustrates a structure in which a probe is attached to an inspection device. The probe includes an insulating covering member (insulating coat) at a central portion in a longitudinal direction of a probe pin. For the attachment, an end face on a tip side of the covering member is locked at an edge portion of a through hole in a support portion of the inspection device. Herein, a base end portion of the probe contacts a terminal of an electrode plate while the central portion of the probe is bent and deformed.

Problem to be Solved by the Invention

The conventional probe is pressed against a test object when an inspection is performed. Thus, the central portion is further bent and deformed with a contact position (locking position) between the covering member and the edge portion as a fulcrum, and the bending amount increases. The base end portion of the probe certainly contacts the terminal of the electrode plate by elasticity due to the increase in the bending amount.

The covering member of the conventional probe repeatedly receives force toward the base end portion of the probe from the edge portion when the inspection is performed.

However, while the conventional probe is attached to the inspection device, the contact with the edge portion restrains the end face on the tip side of the covering member (that is to say, the contact with the edge portion restricts the movement) and an end face on the base end side of the covering member is not restrained (released). Accordingly, only adhesion between the covering member and the surface of the probe pin can maintain the covering member in the position against the force toward the base end portion of the probe applied to the covering member from the edge portion during the inspection.

The adhesion varies depending on a method for providing the covering member and types of materials and is not uniform. The force toward the base end portion of the probe from the edge portion is repeatedly applied to the covering member due to the inspection, so that the adhesion tends to decrease over time.

The contact portion of the covering member with the edge portion particularly may be damaged because it repeatedly receives the above-mentioned force directly due to the inspection. If the damage occurs, the state where the base end portion of the probe certainly contacts the terminal of the electrode plate with stability may not be maintained.

In the case of weak adhesion due to variations in the adhesion, the covering member may be misaligned toward the base end portion of the probe due to the force repeatedly applied to the covering member. The misalignment changes a degree of the elasticity obtained from the bent deformation of the central portion. Accordingly, if this misalignment occurs, the state where the base end portion of the probe certainly contacts the terminal of the electrode plate with stability may not be maintained.

The purpose of the present invention is to reduce a risk of damage of a portion of a covering member to which force is repeatedly directly applied due to an inspection, reduce a risk of misalignment of the covering member, and thereby maintain a state where a base end portion of the probe stably contacts an electrical contact point of the contact inspection device.

SUMMARY OF THE INVENTION

Means for Solving the Problem

In order to solve the problems, a probe according to a first aspect of the present invention is attached to a contact inspection device and used for a contact inspection by being pressed against a test object, wherein the probe includes: a probe base body having a first end as a portion that contacts the test object set in an inspection and a second end that contacts an electrical contact point of the contact inspection device; and a covering member that covers the probe base body between the first end and the second end, the probe is attached in a bent-deformed state by pressing a terminal portion on the first end side of the covering member against a base portion of the contact inspection device, the second end of the probe base body is pressed against the contact point by opposing force due to the pressing, and a portion exposed from the covering member on the second end side of the probe base body is provided with an enlarged diameter portion.

Herein, a "terminal portion" in "a terminal portion on the first end side of the covering member" is a tip portion of the probe base body that contacts a test object. And the terminal portion is a boundary portion between an exposed portion exposed from the covering member and a covered portion.

Herein, an "enlarged diameter portion" is used to indicate a structural portion having a diameter larger than an outer diameter of a portion of the probe base body covered with the covering member. The enlarged diameter portion is preferably provided in contact with the terminal portion on the second end side of the covering member, but it may be provided at a slight distance within a range that can substantially obtain the effects of the invention.

According to this aspect, the probe is attached in the bent-deformed state by pressing the terminal portion on the first end side of the covering member against the base portion of the contact inspection device, and the second end of the probe base body is pressed against the contact point by the opposing force due to the pressing. The portion exposed from the covering member on the second end side of the probe base body is provided with the enlarged diameter portion.

The probe, while it is attached to the inspection device, is kept in its place by the terminal portion on the first end side being in contact with base portion. In other word the contact of the terminal portion with the base portion restrains the terminal portion on the first end side of the covering member. That is to say, the contact of the terminal portion with the base portion restricts the movement. At the same time, the enlarged diameter portion also restricts the terminal portion on the second end side of the covering member. That is to say, the enlarged diameter portion restricts the movement.

In the both-side restraint structure, not only the adhesion between the covering member and a surface of the probe base body but also the restraint force of the enlarged diameter portion is applied as a stopper. This maintains the position of the covering member by opposing the force toward the second end side of the probe applied from the base portion to the covering member during the inspection.

The application of the restraint force stabilizes the adhesion of the entire covering member to the probe base body. This also stabilizes the adhesion of the portion of the covering member to which force is directly applied from the base portion (that is to say, the portion on the first end side of the covering member) during the inspection. As a result, the risk of damage of the portion of the covering member to which the force is repeatedly directly applied due to the inspection can be reduced.

In the case of weak adhesion due to variations in the adhesion, the restraint force of the enlarged diameter portion can reduce the risk of the misalignment of the covering member toward the base end portion of the probe even if the above-mentioned force is repeatedly applied to the covering member. The misalignment changes a degree of elasticity obtained from the bent deformation of the central portion of the probe, but such an occurrence can be suppressed.

Also in the both-side restraint structure, the cylindrical covering member that covers the probe base body increases in deformation resistance against compressive force in the longitudinal direction. In this respect, the above-described effects can also be obtained.

As described above, according to this aspect, the state where the base end portion of the probe contacts the electrical contact point of the contact inspection device with stability can be maintained.

The probe according to a second aspect of the present invention is the probe according to the first aspect, wherein the enlarged diameter portion is formed by adhesion of plating on the second end of the probe base body.

According to this aspect, the enlarged diameter portion is formed by adhesion of plating on the second end of the probe base body, so that it can be easily manufactured in addition to the effects of the first aspect.

The probe according to a third aspect of the present invention is the probe according to the second aspect, wherein a material for the enlarged diameter portion is a conductive material, and the probe base body contacts the contact point by the enlarged diameter portion (In other words; the enlarged diameter portion of the probe base body contacts the contact point).

According to this aspect, the material for the enlarged diameter portion is the conductive material, so that the enlarged diameter portion can be configured to directly contact the electrical contact point of the contact inspection device, which makes the structure simple and suppresses the manufacturing cost at low in addition to the effects of the second aspect.

The probe according to a fourth aspect of the present invention is the probe according to any one of the first to third aspects, wherein a material for the probe base body is copper, rhodium, an alloy of copper, or an alloy of palladium, and the enlarged diameter portion is formed of a nickel plating layer provided on a surface of the probe base body and a plating layer of at least one or more noble metals of gold, palladium, rhodium, platinum, iridium, ruthenium, and osmium provided on the nickel plating layer or a plating layer of an alloy of the noble metal.

According to this aspect, the enlarged diameter portion includes the nickel plating layer located between the material such as copper for the probe base body and the plating layer of the noble metal such as gold, so that the stability of the electrical characteristics as the electrical contact point of the enlarged diameter portion can be increased.

The probe according to a fifth aspect of the present invention is the probe according to any one of the first to fourth aspects, wherein a material for the covering member is an electrically insulating material.

According to this aspect, the insulating cover provided on the probe can be used as the covering member having the effects of each of the aspects, so that it is effective because the number of parts do not increase.

A probe card according to a sixth aspect of the present invention is a structural member of a contact inspection device, wherein the probe card includes: a probe head that includes a probe and a guide member having a through hole for guiding behavior of the probe during an inspection and holding the probe while the probe is inserted in the through hole; and a contact point member that is configured to be separable from the probe head and has an electrical contact point contacting a test object while the probe is pressed against the test object, the probe is the probe according to any one of the first to fifth aspects, and part of the guide member is formed as the base portion against which the terminal portion on the first end side of the covering member is pressed.

According to this aspect, the probe card can obtain the effects of each of the first to fifth aspects.

The probe card according to a seventh aspect of the present invention is the probe card according to the sixth aspect, wherein the guide member includes a first end-side guide member having a through hole in which the first end side of the probe base body is inserted, and a second end-side guide member having a through hole in which the second end side of the probe base body is inserted, and wherein axes of the through holes of the first end-side guide member and the second end-side guide member are misaligned from each other, and this misalignment of the axes achieves the bent deformation.

According to this aspect, the configuration of the bent deformation of the probe that is previously provided can be easily achieved in the state before the inspection.

A contact inspection device according to an eighth aspect of the present invention includes: the probe card according to the sixth aspect or the seventh aspect; a moving unit that moves the probe card relatively with respect to the test object set in a contact inspection position; and an inspection performing unit that performs an inspection while the probe contacts the test object.

According to this aspect, the contact inspection device used for inspection of, for example, a circuit board can obtain the effects of each of the first to fifth aspects or the effects of the sixth aspect or the seventh aspect.

BRIEF DESCRIPTION OF DRAWINGS

These and other features and advantages of the present invention will become more readily appreciated when considered in connection with the following detailed description and appended drawings, wherein like designations denote like elements in the various views, and wherein.

DETAILED DESCRIPTION OF THE INVENTION

A probe, a probe card, and a contact inspection device according to embodiments of the present invention are described below in detail with reference to the accompanying drawings.

Note that, in the following description, an outline of an overall configuration of a contact inspection device used for inspection of, for example, a circuit board according to a first embodiment of the present invention is described first based on FIG. 1. Next, a configuration of a probe card according to the first embodiment of the present invention provided in the contact inspection device is described based on FIG. 2. Then, a specific configuration and actions of the probe according to the first embodiment of the present invention, which is a structural member of the probe card, are described based on FIGS. 3 to 5. Further, a method for assembling a probe card with the probe and a contact inspection method performed on, for example, a circuit board using the contact inspection device are described.

Figure 6:
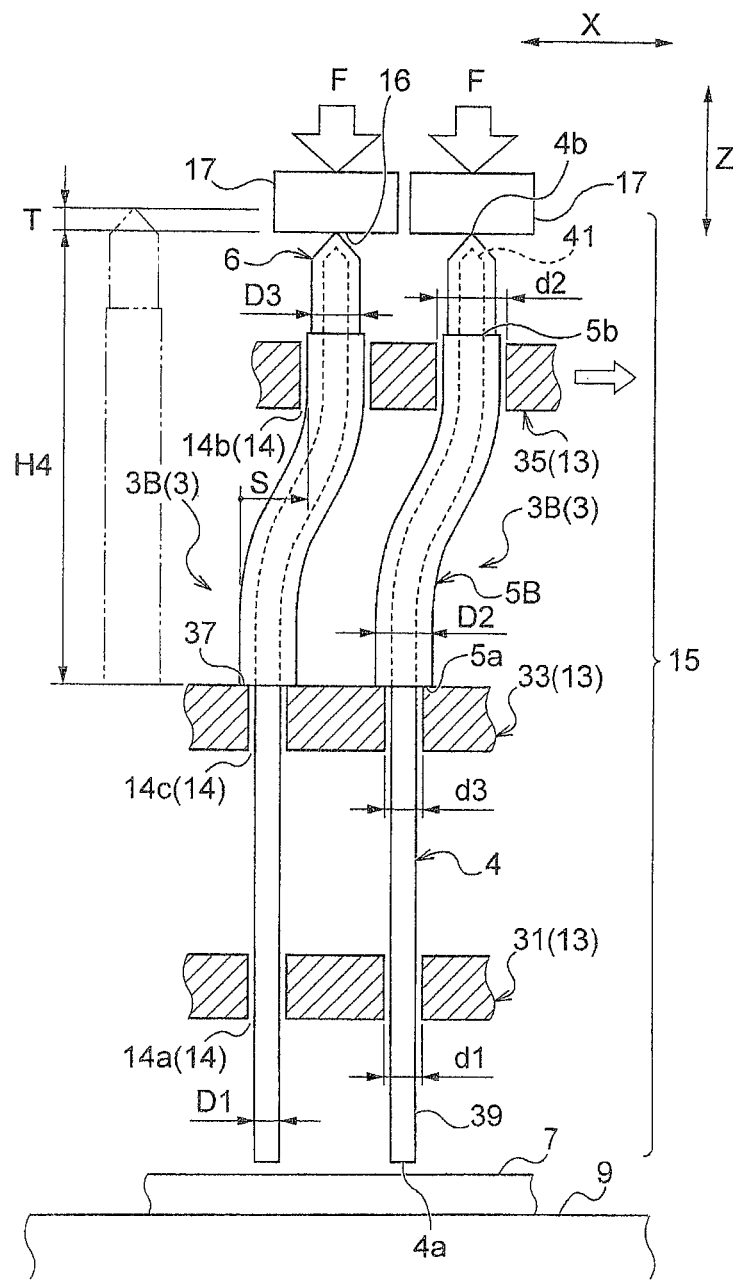
FIG. 6 is a sectional side view illustrating a state after a probe is attached according to a second embodiment of the present invention.

Next, a configuration and actions of a probe according to a second embodiment of the present invention and a probe card with the probe are described based on FIG. 6. Lastly, other embodiments of the present invention whose configuration is partially different from the configuration of the above-mentioned two embodiments are described.

Figure 1:
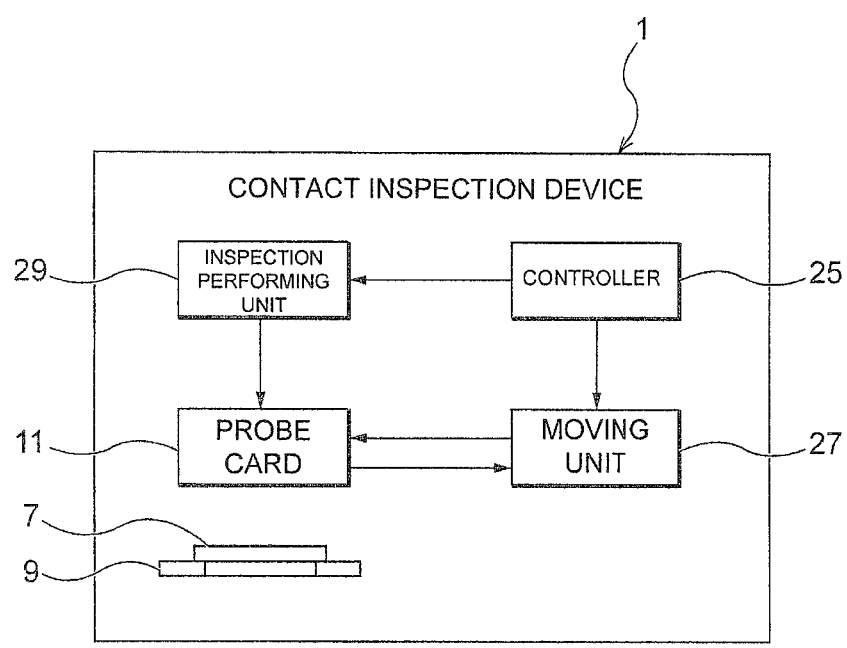
FIG. 1 is a block diagram schematically illustrating an overall configuration of a contact inspection device according to a first embodiment of the present invention.

First Embodiment (1) Outline of Overall Configuration of Contact Inspection Device (See FIG. 1)

A contact inspection device 1 includes a probe card 11 that includes a conductive probe 3 having a spring property. While contacting a test portion of a test object 7, the probe 3 is pressed against the test portion with appropriate pressing force using the spring property, to thereby establish an electrically connected state and perform a contact inspection. Specifically, the probe 3 is energized in this state for measuring electrical characteristics of the test object 7 such as a current value and a voltage difference of each test portion, and a performance test of the whole test object 7 is performed. Accordingly, the contact inspection device 1 is used for the purpose of determining the quality of the test object 7.

Examples of the test object 7 as a test target of the contact inspection device 1 include an electronic circuit board such as a printed wiring board, a semiconductor wafer, and a semiconductor chip such as a packaged IC and LSI. A test portion in direct contact with the probe 3 is, for example, an inspection pattern and an electrode covered with an oxide film on an electronic circuit mounted on the electronic circuit board.

Specifically, a contact inspection device 1A in this embodiment is basically configured to include: a mounting portion 9 as a contact inspection position on which the above-described test object 7 is mounted; a probe card 11A according to this embodiment that includes a plurality of probes 3A according to this embodiment having a spring property, which will be described below; a moving unit 27 that moves the probe card 11A described below in a vertical direction Z, which is a direction relatively close to and away from the test object 7 set on the mounting portion 9 of the contact inspection device 1A; an inspection performing unit 29 that performs an inspection of the test object 7 in contact with the probe 3 described below; and a controller 25 that controls various operations of the moving unit 27 and the inspection performing unit 29.

Figure 2:
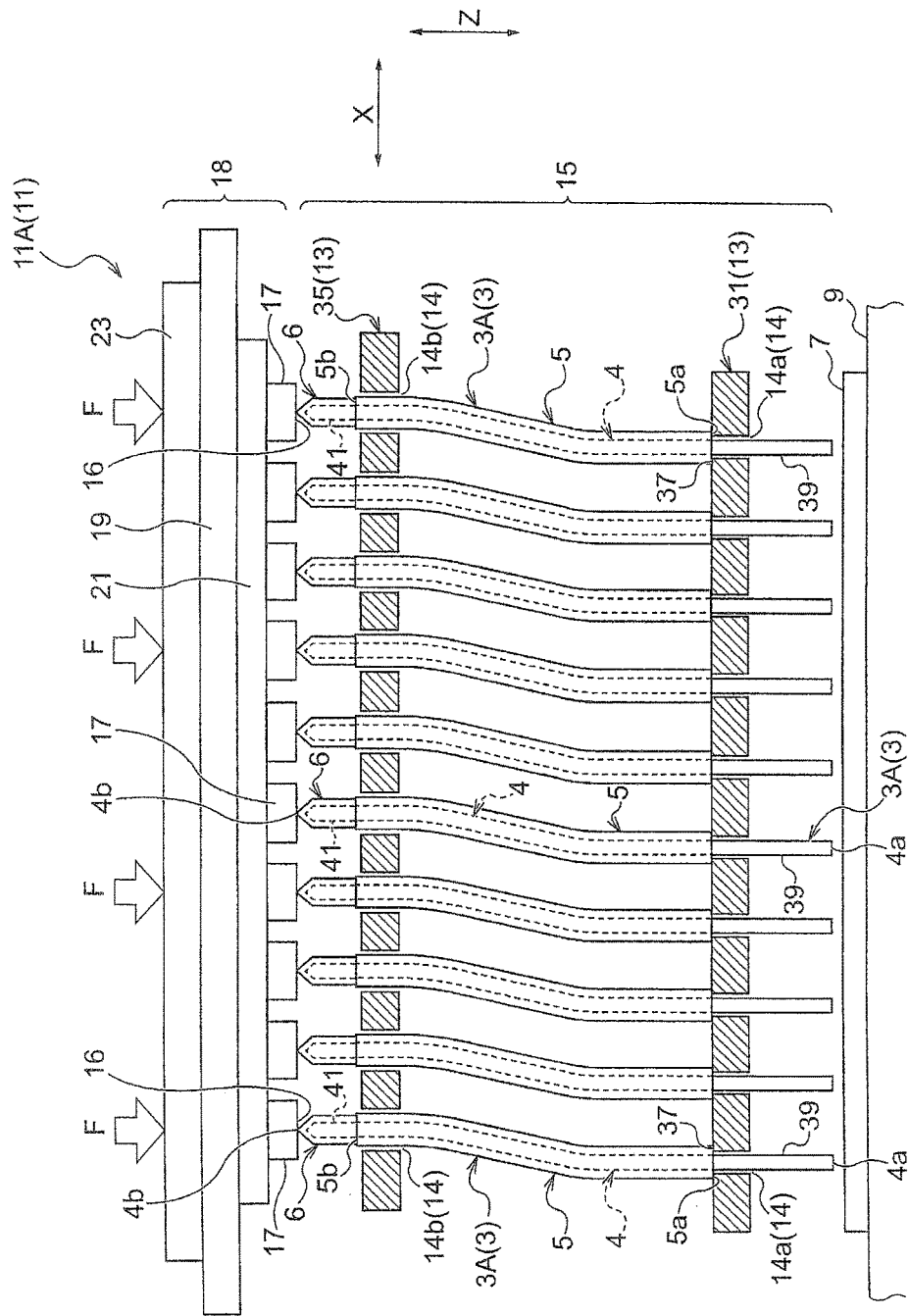
FIG. 2 is a sectional side view schematically illustrating a probe card according to the first embodiment of the present invention.
Figure 3:
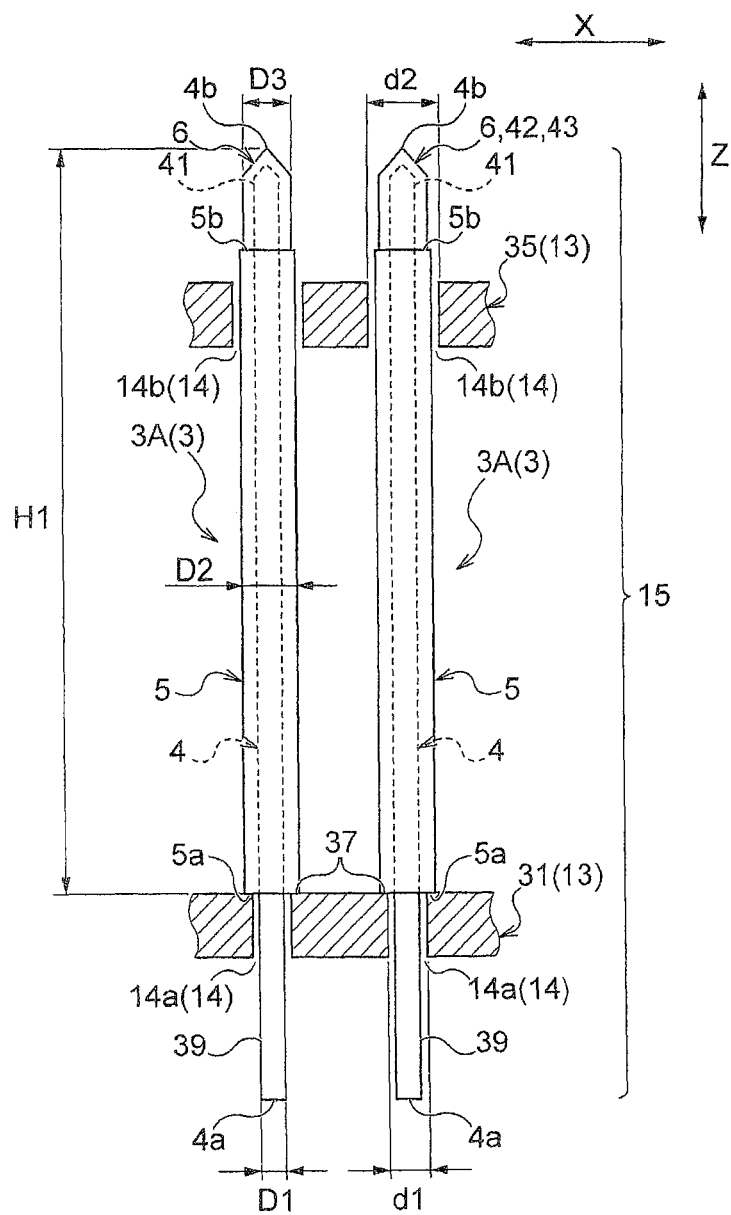
FIG. 3 is a sectional side view illustrating a state before a probe is attached according to the first embodiment of the present invention.
Figure 4:
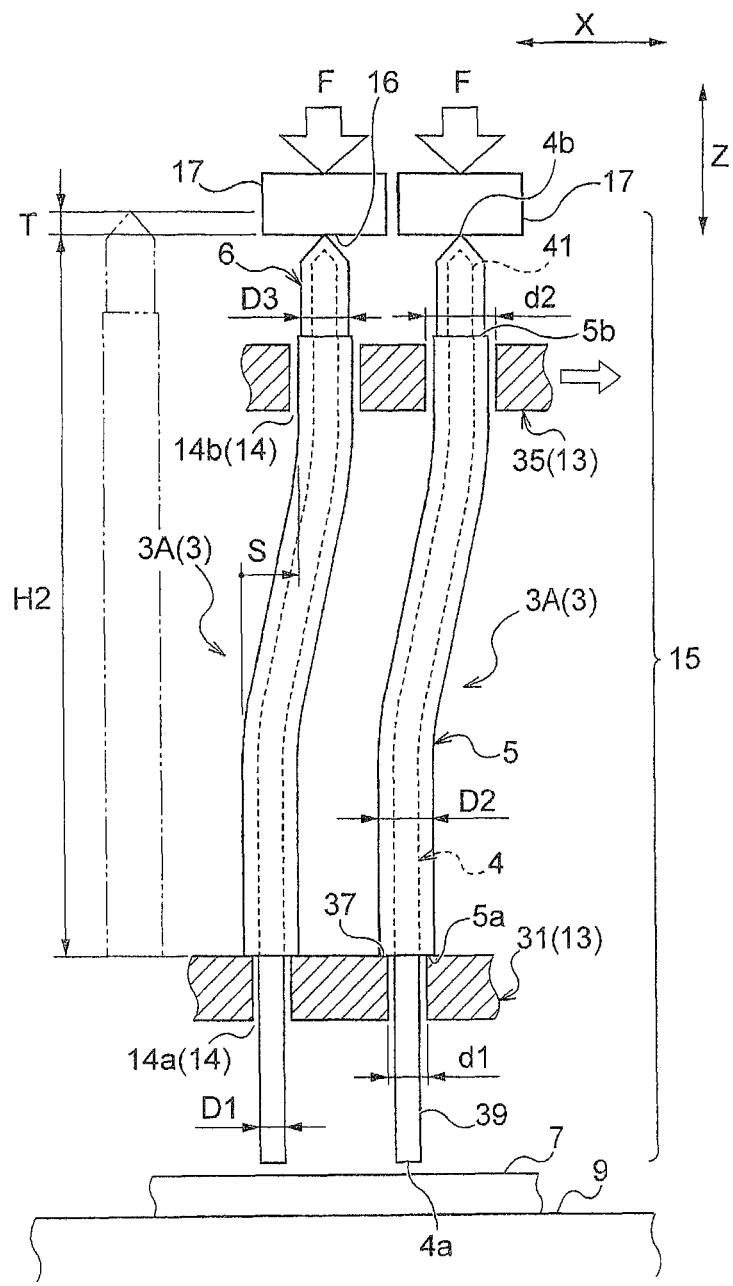
FIG. 4 is a sectional side view illustrating a state after the probe is attached according to the first embodiment of the present invention.

(2) Configuration of Probe Card (See FIGS. 2, 3, and 4)

As illustrated in FIG. 2, the probe card 11 includes a probe head 15 as a main structural member. The probe head 15 includes a plurality of probes 3 having a spring property and guide members 13 that hold the plurality of probes 3. The probe card 11 is configured to be separable from the probe head 15, and includes contact point members (ST lands) 17 that have an electrical contact point 16 to contact the test object 7 while the probe 3 is pressed against the test object 7.

The plurality of contact point members 17 are provided at an input end of a junction substrate 21 for multi-layer wiring and correspond to the number of probes 3. The junction substrate 21 for multi-layer wiring is formed of, for example, a space transformer (ST), multi-layer organic (MLO), or multi-layer ceramic (MLC).

Note that a main substrate 19 is provided at an output end of the junction substrate 21 and reinforced by a reinforcing plate 23. The main substrate 19 is formed by a multi-layer electronic substrate in which a ceramic substrate and wiring substrate are laminated as an example.

The probe card 11A according to this embodiment includes probes 3A according to this embodiment described below and guide members 13. The guide members 13 have through holes 14 for guiding behavior of the probes 3A during an inspection and hold the probes 3A while the probes 3A are inserted in the through holes 14.

The probe 3A according to this embodiment includes a probe base body 4 and a covering member 5. As described below, the probe base body 4 has a first end 4a as a portion that contacts the test object 7 during an inspection and a second end 4b that contacts the contact point 16 of the contact point member 17. The covering member 5 covers the probe base body 4 between the first end 4a and the second end 4b. Part of the guide member 13 is configured to form a base portion 37 that is pressed against a terminal portion 5a on the first end 4a side of the covering member 5.

In this embodiment, the guide member 13 is configured to include a first end-side guide member 31 having a through hole 14a in which the first end 4a side of the probe base body 4 is inserted and a second end-side guide member 35 having a through hole 14b in which the second end 4b side of the probe base body 4 is inserted.

As illustrated in FIG. 3, in this embodiment, an inner diameter d1 of the through hole 14a of the first end-side guide member 31 is formed to be larger than an outer diameter D1 of the probe base body 4 and to be smaller than an outer diameter D2 of the probe 3A where the probe is covered by the covering member 5. An inner diameter d2 of the through hole 14b of the second end-side guide member 35 is formed to be larger than the inner diameter d1 of the through hole 14a of the first end-side guide member 31 and to be larger than the outer diameter D2 of the probe 3A where the probe is covered by the covering member 5.

In this embodiment, the first end-side guide member 31 is provided in a fixed state that restricts movement in both of the vertical direction Z, which is a direction close to and away from the test object 7, and a horizontal direction X, which crosses the vertical direction Z. In contrast, the second end-side guide member 35 is provided in a slidable state that restricts movement in the vertical direction Z but allows movement of a predetermined stroke S in the horizontal direction X.

As illustrated in FIG. 4, a preload pressed with a pressed contact force F based on a predetermined travel amount T is previously performed on the probe 3A held by the guide members 13 having such a configuration to stabilize a contact state between the contact point member 17 and the second end 4b of the probe base body 4. The contact point member 17 is pressed downward by the preload while the second end-side guide member 35 is moved by the predetermined stroke S in the horizontal direction X. In this state, a position of the second end-side guide member 35 is fixed by a fixing mechanism, which is not illustrated. In this way, axes of the through holes 14a, 14b of the first end-side guide member 31 and the second end-side guide member 35, respectively, are misaligned from each other. This misalignment of the axes achieves a bent-deformed state as illustrated that provides the spring property to the probe 3A.

(3) Specific Configuration and Actions of Probe (See FIGS. 3 and 4)

As described above, the probe 3A according to this embodiment includes the probe base body 4 and the covering member 5. The probe base body 4 has the first end 4a as a portion that contacts the test object 7 set during an inspection and the second end 4b that contacts the contact point 16 of the contact point member 17. The covering member 5 covers the probe base body 4 between the first end 4a and the second end 4b.

As illustrated in FIG. 4, the probe 3A is attached in the bent-deformed state by pressing the terminal portion 5a on the first end 4a side of the covering member 5 against the base portion 37, as the base portion 37, an upper edge around the through hole 14a of the first end-side guide member 31 in response to the preload structure, as described above. In the attachment state, the second end 4b of the probe base body 4 is configured to be pressed against the contact point 16 of the contact point member 17 by opposing force of the pressed contact force F due to the preload.

An exposed portion 41 exposed from the covering member 5 on the second end 4b side of the probe base body 4 is provided with an enlarged diameter portion 6 that is a structural member of the probe 3A.

The probe base body 4 is a round-bar member whose outer diameter D1 is several tens of micrometers as an example with the flat first end 4a and the tapered second end 4b. The probe base body 4 is formed of an elastic, deformable, and conductive material made of copper, rhodium, an alloy of copper, or an alloy of palladium as an example. An exposed portion 39 that is not covered with the covering member 5 is formed on the first end 4a side of the probe base body 4. This exposed portion 39 is inserted in the through hole 14a of the first end-side guide member 31. A tip surface of the exposed portion 39, which is the first end 4a of the probe base body 4, is a contact point that contacts a predetermined test portion of the test object 7.

As described above, the exposed portion 41 that is not covered with the covering member 5 is also formed on the second end 4b side of the probe base body 4. Then, plating is applied to the entire exposed portion 41 to form the above-described enlarged diameter portion 6.

As illustrated in FIG. 3, the enlarged diameter portion 6 in this embodiment is formed of a nickel plating layer 42 provided on the surface of the exposed portion 41 and a gold plating layer 43 provided on the nickel plating layer 42. Note that a surface layer provided on the nickel plating layer 42 is not limited to the gold plating layer 43, and may be a plating layer of at least one or more noble metals of palladium, rhodium, platinum, iridium, ruthenium, and osmium. Alternatively, the surface layer may be a plating layer of an alloy of the noble metal. Herein, an alloy that contains appropriate components within a range that fulfills stability of electrical characteristics as an electrical contact point of the enlarged diameter portion 6 may be used as the alloy of the noble metal on the assumption that the noble metal is contained.

Thus, the nickel plating layer 42 is located between a material, such as copper, for the probe base body and the gold plating layer 43, so that the stability of the electrical characteristics as the electrical contact point of the enlarged diameter portion 6 can be increased.

Furthermore, an outer diameter D3 of the enlarged diameter portion 6 is set to be larger than the outer diameter D1 of the portion of the probe base body 4 covered with the covering member 5 and to be smaller than the outer diameter D2 of the portion of the probe 3A covered with the covering member 5. Note that as long as the outer diameter D3 of the enlarged diameter portion 6 is formed to be larger than the outer diameter D1 of the portion of the probe base body 4 covered with the covering member 5 and the above-mentioned effect of the both-side restraint structure is obtained, the outer diameter D3 may be larger than the outer diameter D2 of the portion of the probe 3A covered with the covering member 5.

In this embodiment, the covering member 5 is formed by a cylindrical sleeve-shaped member made of an electrically insulating material provided in close contact with the surface of the probe base body 4. The probe 3A is then attached while the portion on the second end 4b side of the covering member 5 is inserted in the through hole 14b of the second end-side guide member 35. The above-mentioned bent deformation further advances as the first end 4a of the probe 3A is pressed against the test object 7 during a contact inspection. In this way, the portion on the second end 4b side of the covering member 5 of the probe 3A moves in the vertical direction Z in the through hole 14b of the second end-side guide member 35. To facilitate the movement, the covering member 5 is thus formed by an insulating coat including polyester containing fluorine as an example of a material having a low coefficient of friction when sliding along an inner surface of the through hole 14b.

Also in this embodiment, the covering member 5 has such a configuration as follows. The terminal portion 5a on the first end 4a side of the covering member 5 abuts against, as the base portion 37 described above, the upper edge around the through hole 14a of the first end-side guide member 31. The terminal portion 5b on the second end 4b side of the covering member 5 contacts a lower surface of the enlarged diameter portion 6.

A distance H from the upper edge of the base portion 37 of the probe 3A according to this embodiment having such a configuration to the tip on the second end 4b side (portion that contacts the contact point 16 of the contact point member 17) becomes the longest distance H1 in the state before the attachment as illustrated in FIG. 3. In the state after the attachment as illustrated in FIG. 4, the distance H becomes a distance H2 shorter than the distance H1 by the travel amount T based on the pressed contact of the preload.

Figure 5:
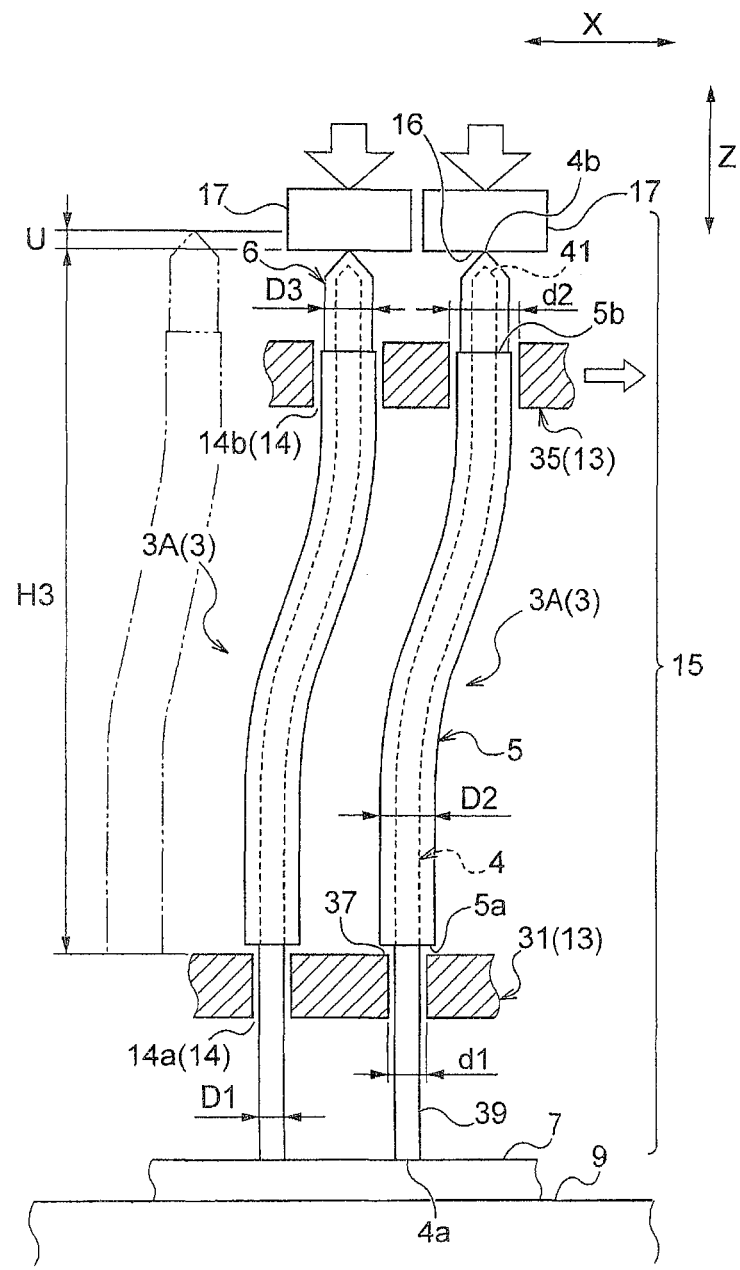
FIG. 5 is a sectional side view illustrating a state where the probe is pressed and contacted during an inspection according to the first embodiment of the present invention.

During an inspection as illustrated in FIG. 5, the distance H becomes a distance H3 even shorter than the distance H2 by a travel amount U due to the application of more pressure to the probe 3A from the state of FIG. 4.

(4) Method for Assembling Probe Card (See FIGS. 3 and 4)

Next, description is made on an example of a method for assembling the probe card 11A according to this embodiment with the probe 3A according to this embodiment described above.

First, as illustrated in FIG. 3, the probe 3A according to this embodiment is attached to the guide members 13 while the axis of the through hole 14a of the first end-side guide member 31 coincides with the axis of the through hole 14b of the second end-side guide member 35. In this state, the probe 3A is linear. The terminal portion 5a of the covering member 5 on the first end 4a side of the probe 3A contacts the upper edge around the through hole 14a of the first end-side guide member 31, namely, the base portion 37, to define the position of the probe 3A. The exposed portion 39 on the first end 4a side of the probe base body 4 is inserted in the through hole 14a of the first end-side guide member 31 and extends downward.

On the second end 4b side of the probe 3A, the portion on the second end 4b side of the covering member 5 extends upward while being inserted in the through hole 14b of the second end-side guide member 35.

Next, the probe head 15 in which the probe 3A is attached in this manner is mounted on a platform 18 (FIG. 2) formed of the reinforcing plate 23, the main substrate 19, and the junction substrate 21.

At this time, the preload is performed such that the contact point member 17 is pressed downward by the predetermined travel amount T with the pressed contact force F and brought into the state as illustrated in FIG. 4. That is to say, while the pressed contact force F acts on the probe 3A, the second end-side guide member 35 is moved by the predetermined stroke S in the horizontal direction X and its position is fixed. As illustrated in FIG. 4, the probe base body 4 and the covering member 5 are thus bent and deformed into an S-shape to provide the spring property to the probe 3A.

Then, by such opposing force that the bent and deformed probe base body 4 and covering member 5 by the preload are restored to the original linear state, contact pressure between the second end 4b of the probe base body 4 and the contact point 16 of the contact point member 17 increases to maintain the stability of the contact state therebetween.

In the state illustrated in FIG. 4, the tip of the enlarged diameter portion 6 provided at the second end 4b of the probe base body 4 contacts the contact point 16 of the contact point member 17. On the other hand, the tip of the exposed portion 39, which is the first end 4a of the probe base body 4, faces a predetermined test portion of the test object 7 set on the mounting portion 9 of the contact inspection device 1.

(5) Contact Inspection Method (See FIG. 5)

Next, description is made on a contact inspection method performed by using the contact inspection device 1A according to this embodiment that includes the probe card 11A assembled as described above and mounted on the platform 18.

The controller 25 moves the moving unit 27, and further moves the probe card 11A by the predetermined travel amount U toward the test object 7. Accordingly, as illustrated in FIG. 5, the probe base body 4 and the covering member 5 are more bent and deformed, and the spring property of the probe 3A increases. This achieves contact of the contact point on the first end 4a side with the test object under desired pressure.

In this state, the controller 25 drives the inspection performing unit 29 to allow a flow of current therethrough, to thereby perform a predetermined contact inspection. After completion of the contact inspection, the controller 25 stops driving the inspection performing unit 29 and drives the moving unit 27 to move the probe card 11A in a direction away from the test object 7 to a standby position. Then, the test object 7 finished with the contact inspection is removed. Next, a new test object 7 for a contact inspection is set on the mounting portion 9. Hereinafter, the similar operation is repeated to perform a contact inspection of the necessary number of test objects 7.

As described above, according to this embodiment, the probe 3A is attached in the bent-deformed state by pressing the terminal portion 5a on the first end 4a side of the covering member 5 against the base portion 37 of the contact inspection device 1, and the second end 4b of the probe base body 4 is pressed against the contact point 16 of the contact point member 17 by the opposing force due to the above-mentioned pressing. The portion exposed from the covering member 5 on the second end 4b side of the probe base body 4 (the exposed portion 41) is provided with the enlarged diameter portion 6.

While the probe 3A is attached to the contact inspection device 1, the enlarged diameter portion 6 restrains the terminal portion 5a on the first end 4a side of the covering member 5 due to the contact of the terminal portion 5a with the base portion 37. That is to say, the enlarged diameter portion 6 restricts the movement of the terminal portion 5a toward the test object 7 due to the contact of the terminal portion 5a with the base portion 37. Also, the enlarged diameter portion 6 restrains the terminal portion 5b on the second end 4b side of the covering member 5.

In the both-side restraint structure, not only the adhesion between the covering member 5 and the surface of the probe base body 4 but also the restraint force of the enlarged diameter portion 6 is applied as a stopper. This maintains the position of the covering member 5 by opposing the force toward the second end 4b side of the probe 3A applied from the base portion 37 to the covering member 5 during the inspection.

The application of the restraint force stabilizes the adhesion of the entire covering member 5 to the probe base body 4. This also stabilizes the adhesion of the portion on the first end 4a side of the covering member 5 to which force is directly applied from the base portion 37 during the inspection. As a result, a risk of damage of the portion of the covering member 5 to which the force is repeatedly directly applied (the terminal portion 5a on the first end 4a side) due to the contact inspection can be reduced.

In the case of weak adhesion due to variations in the adhesion, the restraint force of the enlarged diameter portion 6 can reduce a risk of the misalignment of the covering member 5 toward the base end portion (the second end 4b side) of the probe 3A even if the above-mentioned force is repeatedly applied to the covering member 5. The misalignment changes a degree of elasticity obtained from the bent deformation of the central portion of the probe 3A, but such an occurrence can be suppressed.

Also in the both-side restraint structure, the cylindrical covering member 5 that covers the probe base body 4 increases in deformation resistance against compressive force in the longitudinal direction. In this respect, the above-described effects can also be obtained.

As described above, according to this embodiment, the state where the base end portion (the second end 4b) of the probe 3A contacts the electrical contact point 16 of the contact inspection device 1 with stability can be maintained.

In the probe 3A, the probe card 11A, and the contact inspection device 1A having such a configuration according to this embodiment, the covering member 5 provided for securing insulation has a function as a mechanical stopper, instead of processing a protrusion of high strength that functions as a stopper on the probe base body 4 by pressing or welding with high precision in the conventional manner. As a result, the probe 3A and the probe card 11A can have the same function simply and at low cost.

Second Embodiment

Next, a configuration and actions of a probe 3B and a probe card 11B with the probe 3B according to a second embodiment of the present invention are described.

The configurations of guide members 13 and a covering member 5B are partially modified in the probe 3B and the probe card 11B according to this embodiment. However, the other configurations of the probe 3B and the probe card 11B are basically the same as those of the probe 3A and the probe card 11A according to the first embodiment described above. Thus, description of the same configuration as that of the first embodiment is omitted here. The configurations of the guide members 13 and the covering member 5B different from those of the first embodiment and their actions are mainly described.

That is to say, the guide members 13 are formed of three guide members that are the first end-side guide member 31 and the second end-side guide member 35 described above and an intermediate guide member 33 provided therebetween in this embodiment.

The intermediate guide member 33 is a fixed guide member similar to the first end-side guide member 31 described above. The intermediate guide member 33 has a plurality of through holes 14c having an inner diameter d3 similar to the inner diameter d1 of the through hole 14a of the first end-side guide member 31. The same number of through holes 14c is located in positions corresponding to the through holes 14a, and an axis of the through hole 14c coincides with the axis of the through hole 14a.

The covering member 5B has the same structure as that of the covering member 5 of the probe 3A according to the first embodiment. However, the covering member 5B is provided in an area smaller than the area in which the covering member 5 of the first embodiment is provided.

Specifically, the terminal portion 5a on the first end 4a side of the covering member 5B is located above the position thereof in the first embodiment, and is set in a position that abuts against an upper edge around the through hole 14c of the intermediate guide member 33. Then, the upper edge of the intermediate guide member 33 is the base portion 37 in this embodiment.

Therefore, the first end-side guide member 31 in this embodiment only functions as a guide member that guides the movement of the exposed portion 39 on the first end 4a side of the probe base body 4 in the vertical direction Z, and does not function as a stopper as in the first embodiment.

On the other hand, in this embodiment, the intermediate guide member 33 functions as the stopper. The probe base body 4 and the covering member 5B are each configured to be bent and deformed into the S-shape by the application of the compressive force between the contact point member 17 described above and the intermediate guide member 33 newly provided in this embodiment. Thus, the exposed portion 39 from the terminal portion 5a on the first end 4a side of the covering member 5B to the contact of the first end 4a of the probe base body 4 with the test object 7 is longer than the exposed portion 39 of the probe 3A in the first embodiment. On the other hand, the distance H between the base portion 37 of the probe 3B and the contact point 16 of the contact point member 17 is a distance H4 shorter than that in the first embodiment.

The probe 3B and the probe card 11B having such a configuration according to this embodiment and the contact inspection device 1 that includes the probe 3B and the probe card 11B can also obtain the same actions and effects as those of the probe 3A, the probe card 11A, and the contact inspection device 1A according to the first embodiment described above.

Also in this embodiment, because the area in the vertical direction Z in which the probe base body 4 and the covering member 5B are bent and deformed is smaller, the bending and deformed amount and the pressure applied to the ends of the probe 3B are different from those in the first embodiment. Thus, the bending properties and the pressure of the probe 3B can be controlled by using the differences.

Other Embodiments

The probe 3, the probe card 11, and the contact inspection device 1 according to the present invention basically have the configuration as described above. However, part of configurations can also be modified or omitted without departing from the purpose of the invention.

For example, the covering member 5, which has been conventionally provided for having insulation properties, functions as the mechanical stopper that prevents the misalignment from the probe base body 4 in the present invention. Accordingly, as long as a material for the covering member 5 has insulation properties, flexibility, and mechanical strength that can sufficiently exert the function, various materials are applicable without being limited to the above-mentioned material in the first embodiment described above.

Further, the area in which the covering member 5 is formed can be set by defining an area in which a wire rod for the probe base body 4 is coated with the insulating coat during coating. Also, the area in which the covering member 5 is formed is adjustable by peeling part of the insulating coat formed once on the entire wire rod for the probe base body 4. Alternatively, the covering member 5 can also be provided by inserting the wire rod for the probe base body 4 in a cylindrical tube.

The contact state between the lower surface of the enlarged diameter portion 6 and the terminal portion 5b on the second end 4b side of the covering member 5 may be formed by at least when they are contacted and pressed during the inspection illustrated in FIG. 5. Thus, there may be a slight clearance between them in the state before the attachment of the probe 3 illustrated in FIG. 3.

The structure of the enlarged diameter portion 6 is not limited to a structure in which plating is applied to the entire exposed portion 41. Instead, plating may be applied not to the entire but to part of the exposed portion 41 to the extent that can obtain the effects of the above-mentioned both-side restraint structure. In this case, the tip on the first end 4a side of the exposed portion 41 contacts the contact point 16 of the contact point member 17.

Further, the procedure for the method for assembling the probe card 11 is not limited to the procedure described in the first embodiment. The preload may be performed after the second end-side guide member 35 slides by the predetermined stroke S in the horizontal direction X. Alternatively, the second end-side guide member 35 may slide by the predetermined stroke S in the horizontal direction X after the preload.

The invention claimed is:

1. A probe that is attached to a contact inspection device and used for contact inspection by being pressed against a test object, the probe comprising:
   a probe base body having a first end as a portion that contacts the test object during the inspection and a second end that contacts an electrical contact point of the contact inspection device; and
   a covering member that covers the probe base body between the first end and the second end, wherein
   the probe is attached in a bent-deformed state by pressing a first terminal portion on a first end side of the covering member against a base portion of the contact inspection device,
   the second end of the probe base body is pressed against the contact point by an opposing force due to the pressing,
   a portion exposed from the covering member on a second end side of the probe base body is provided with an enlarged diameter portion, and
   a second terminal portion on the second end side of the covering member is in contact with the enlarged diameter portion.

2. The probe according to claim 1, wherein the enlarged diameter portion is formed by adhesion of plating on the second end of the probe base body.

3. The probe according to claim 2, wherein a material for the enlarged diameter portion is a conductive material, and the enlarged diameter portion contacts the contact point.

4. The probe according to claim 3, wherein a material for the probe base body is copper, rhodium, an alloy of copper, or an alloy of palladium, and the enlarged diameter portion is formed of a nickel plating layer provided on a surface of the probe base body and a plating layer of at least one or more noble metals of gold, palladium, rhodium, platinum, iridium, ruthenium, and osmium provided on the nickel plating layer or a plating layer of an alloy of the noble metal.

5. The probe according to claim 4, wherein a material for the covering member is an electrically insulating material.

6. The probe according to claim 3, wherein a material for the covering member is an electrically insulating material.

7. A probe card that is a structural member of a contact inspection device, the probe card comprising:
   a probe head that includes a probe and a guide member having a through hole for guiding behavior of the probe during an inspection and holding the probe while the probe is inserted in the through hole; and
   a contact point member that is configured to be separable from the probe head and has an electrical contact point contacting a test object while the probe is pressed against the test object, wherein
   the probe is the probe according to claim 3, and
   part of the guide member is formed as the base portion against which the terminal portion on the first end side of the covering member is pressed.

8. The probe card according to claim 7, wherein the guide member includes:
   a first end-side guide member having a through hole in which the first end side of the probe base body is inserted, and
   a second end-side guide member having a through hole in which the second end side of the probe base body is inserted, wherein
   axes of the through holes of the first end-side guide member and the second end-side guide member are misaligned from each other, and this misalignment of the axes achieves the bent deformation.

9. The probe according to claim 1, wherein a material for the probe base body is copper, rhodium, an alloy of copper, or an alloy of palladium, and the enlarged diameter portion is formed of a nickel plating layer provided on a surface of the probe base body and a plating layer of at least one or more noble metals of gold, palladium, rhodium, platinum, iridium, ruthenium, and osmium provided on the nickel plating layer or a plating layer of an alloy of the noble metal.

10. A probe card that is a structural member of a contact inspection device, the probe card comprising:
    a probe head that includes a probe and a guide member having a through hole for guiding behavior of the probe during an inspection and holding the probe while the probe is inserted in the through hole; and
    a contact point member that is configured to be separable from the probe head and has an electrical contact point contacting a test object while the probe is pressed against the test object, wherein
    the probe is the probe according to claim 9, and
    part of the guide member is formed as the base portion against which the terminal portion on the first end side of the covering member is pressed.

11. The probe card according to claim 10, wherein the guide member includes:
    a first end-side guide member having a through hole in which the first end side of the probe base body is inserted, and
    a second end-side guide member having a through hole in which the second end side of the probe base body is inserted, wherein
    axes of the through holes of the first end-side guide member and the second end-side guide member are misaligned from each other, and this misalignment of the axes achieves the bent deformation.

12. The probe according to claim 1, wherein a material for the covering member is an electrically insulating material.

13. A probe card that is a structural member of a contact inspection device, the probe card comprising:
    a probe head that includes a probe and a guide member having a through hole for guiding behavior of the probe during an inspection and holding the probe while the probe is inserted in the through hole; and
    a contact point member that is configured to be separable from the probe head and has an electrical contact point contacting a test object while the probe is pressed against the test object, wherein
    the probe is the probe according to claim 1, and part of the guide member is formed as the base portion against which the terminal portion on the first end side of the covering member is pressed.

14. The probe card according to claim 13, wherein the guide member includes:
   a first end-side guide member having a through hole in which the first end side of the probe base body is inserted, and
   a second end-side guide member having a through hole in which the second end side of the probe base body is inserted, wherein
axes of the through holes of the first end-side guide member and the second end-side guide member are misaligned from each other, and this misalignment of the axes achieves the bent deformation.

15. A contact inspection device comprising:
the probe card according to claim 14;
a moving unit that moves the probe card relatively with respect to the test object set in a contact inspection position; and
an inspection performing unit that performs an inspection while the probe contacts the test object.

16. A contact inspection device comprising:
the probe card according to claim 13;
a moving unit that moves the probe card relatively with respect to the test object set in a contact inspection position; and
an inspection performing unit that performs an inspection while the probe contacts the test object.

17. A probe that is attached to a contact inspection device and used for contact inspection by being pressed against a test object, the probe comprising:
   a probe base body having a first end as a portion that contacts the test object during the inspection and a second end that contacts an electrical contact point of the contact inspection device; and
   a covering member that covers the probe base body between the first end and the second end, wherein
the probe is attached in a bent-deformed state by pressing a terminal portion on a first end side of the covering member against a base portion of the contact inspection device,
a portion exposed from the covering member on a second end side of the probe base body is provided with an enlarged diameter portion, and
the enlarged diameter portion is pressed against the contact point by an opposing force due to the pressing.

18. A probe that is attached to a contact inspection device and used for contact inspection by being pressed against a test object, the probe comprising:
   a probe base body having a first end as a portion that contacts the test object during the inspection and a second end that contacts an electrical contact point of the contact inspection device; and
   a covering member that covers the probe base body between the first end and the second end, wherein
the probe is attached in a bent-deformed state by pressing a terminal portion on a first end side of the covering member against a base portion of the contact inspection device,
the second end of the probe base body is pressed against the contact point by opposing force due to the pressing, and
a portion exposed from the covering member on a second end side of the probe base body is entirely covered by an enlarged diameter portion.

* * * * *